United States Patent

Fukuyama et al.

Patent Number: 5,770,260
Date of Patent: Jun. 23, 1998

[54] PROCESS FOR FORMING SILICON DIOXIDE FILM

[75] Inventors: Shun-ichi Fukuyama; Daitei Shin, both of Kawasaki; Yuki Komatsu, Tokyo; Hideki Harada, Satsuma-gun; Yoshihiro Nakata, Kawasaki; Michiko Kobayashi, Kawasaki; Yoshiyuki Okura, Kawasaki, all of Japan

[73] Assignees: Fujitsu Limited, Kawasaki; Kyushu Fujitsu Electronics Limited, Kagoshima, both of Japan

[21] Appl. No.: 886,018

[22] Filed: Jun. 30, 1997

Related U.S. Application Data

[63] Continuation of Ser. No. 582,024, Jan. 2, 1996, abandoned, which is a continuation of Ser. No. 281,077, Jul. 27, 1994, abandoned.

[30] Foreign Application Priority Data

Jul. 29, 1993 [JP] Japan .................................. 5-188156

[51] Int. Cl.$^6$ ................. B05D 3/02; B05D 3/06
[52] U.S. Cl. ................ 427/226; 427/539; 427/557; 427/558; 427/397.7; 438/789; 438/790

[58] Field of Search .................. 427/558, 557, 427/539, 397.7, 226; 428/688; 438/787, 789, 790, 788, 781; 359/36

[56] References Cited

U.S. PATENT DOCUMENTS 4,116,658  9/1978  Sano ............................................ 65/42

FOREIGN PATENT DOCUMENTS 5-121572  5/1993  Japan .
5-243212  9/1993  Japan .

*Primary Examiner*—Roy V. King
*Attorney, Agent, or Firm*—Armstrong, Westerman, Hattori, McLeland & Naughton

[57] ABSTRACT

A process capable of forming an inorganic film which can be used at a relatively large thickness equivalent to, or greater than, the thickness of an organic SOG, without being subjected to oxidation by $O_2$ plasma treatment used in a fabrication process of a semiconductor device. Polysilazane is first coated on a base, and the resulting polysilazane film is converted to a silicon dioxide film.

7 Claims, 8 Drawing Sheets

Fig.15

PROCESS FOR FORMING SILICON DIOXIDE FILM

This application is a continuation of application Ser. No. 08/582,024 filed Jan. 2, 1996, now abandoned; which is a continuation of application Ser. No. 08/281,077 filed Jul. 27, 1994, now abandoned.

BACKGROUND OF THE INVENTION

1. Field of the Invention

This invention relates to a process for forming a silicon dioxide film. Since the silicon dioxide film obtained by the process of the present invention can be formed by the use of polymer materials soluble in an organic solvent, a base step can be made flat. Since it is not oxidized by an oxygen plasma treatment employed during a fabrication process of semiconductor devices, it can be used as an insulating film in place of, or in combination with, a CVD film that has been used in the past. The silicon dioxide film obtained by the process of the present invention can be used at a greater thickness than an inorganic SOG material, and can make a base step sufficiently flat.

2. Description of the Related Art

With the improvement in the integration density of semiconductor integrated circuits in recent years, a surface step after device formation has become greater, and the thickness of wirings must be increased so as to prevent a drop in wiring capacity resulting from miniaturization of wirings. The latter means that the step after wiring becomes greater. Accordingly, a formation method of an insulating film capable of providing excellent flatness has become necessary. To satisfy this requirement, an inorganic SOG consisting of tetrafunctional siloxane units or an organic SOG consisting of tetrafunctional siloxane units and trifunctional siloxane units is used as a flattening material for an inter-level insulating film. However, since the inorganic SOG is likely to undergo cracking due to heat-treatment, it is used in the form of a thin film of below 0.1 μm on a wiring substrate. The organic SOG is likely to undergo oxidation cracking due to oxygen plasma treatment, and is therefore used in a sandwich structure in combination with a CVD film using an etch-back step. A process in which polysilazane is heat treated and used as a silicon oxynitride film (Japanese Unexamined Patent Publication (Kokai) No. 62-88327) and a process in which polysilazane is heat treated in a vapor atmosphere and converted to a silicon dioxide film (Japanese Patent Application No. 3-279633) have been proposed.

Figure 1:
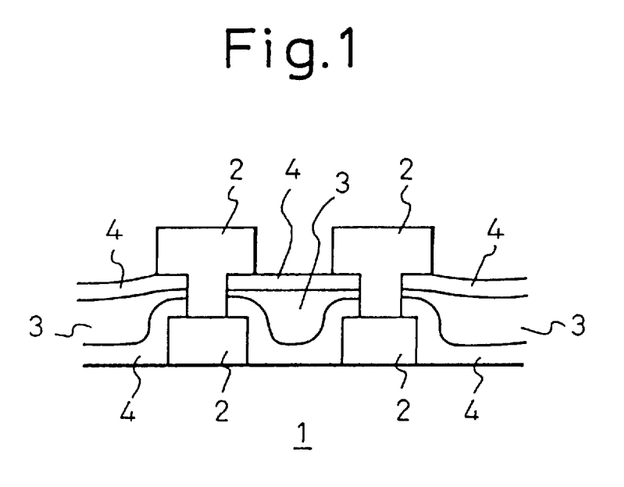
FIG. 1 is a schematic cross-sectional view of a conventional semiconductor device having an organic SOG film.

As described above, flattening of the base step by the use of the SOG materials has been examined in the past. However, since the inorganic SOG can be used only in a thin film of below 0.1 μm, a satisfactory flattening effect cannot be obtained for the base step. Even when used in a relative thick film of not greater than 0.5 μm, the organic SOG does not undergo cracking due to the heat-treatment, but cracks easily occur when the organic SOG is oxidized by the $O_2$ plasma treatment used for the fabrication process of the semiconductor device. For this reason, a process of use which does not expose the SOG film on the through-hole side surface, that is, as shown in FIG. 1, a process which coats SOG on the CVD film and then etches back the entire surface so as not to leave the SOG film on the step, has been employed. In FIG. 1, 1 denotes a silicon substrate, 2 denotes an aluminum wiring, 3 denotes an organic SOG film, and 4 denotes a CVD film.

Figure 3:
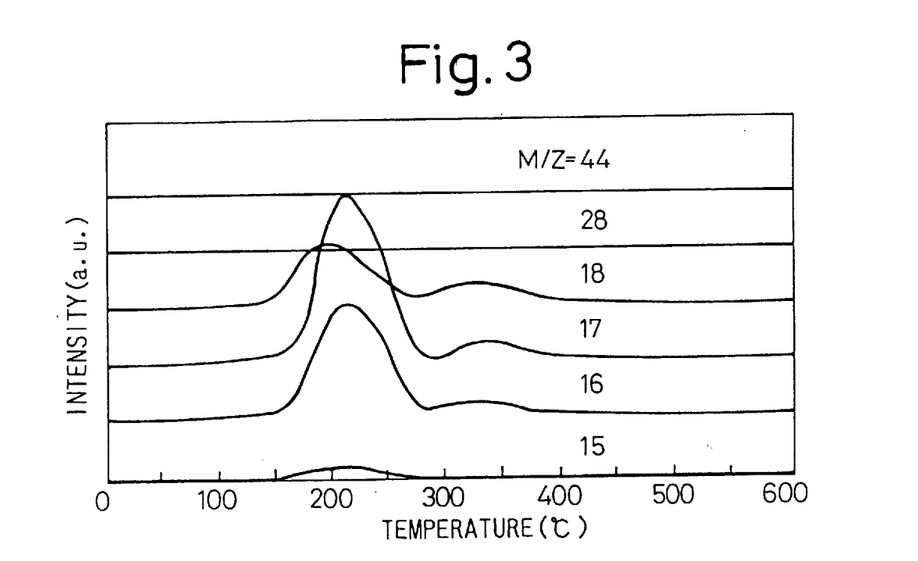
FIG. 3 is a diagram showing the result of degassing analysis of a silicon dioxide film obtained in an example after heating.

The silicon oxynitride film formed by using polysilazane, that has already been reported, involves the problem that emission of an amine type gas is observed at the time of re-heating (FIG. 3). According to the process which effects heat-treatment in the vapor atmosphere, corrosion of the aluminum used for the wiring material due to vapor or the amine type gas is observed. Therefore, this process is not free from the drawback that a film having high water resistance formed by an expensive apparatus such as an ECR plasma CVD apparatus must be used.

SUMMARY OF THE INVENTION

It is the primary object of the present invention to solve these problems with the prior art, and to provide a process capable of forming an inorganic film which can be used at a relatively thick film thickness at least equal to the thickness of the organic SOG without being oxidized by the $O_2$ plasma treatment employed by the fabrication process of the semiconductor device and without involving corrosion of aluminum of the wiring materials.

In order to accomplish the object described above, in an aspect, the present invention provides a process for forming a silicon dioxide film comprising coating polysilazane on a base, and converting the resulting polysilazane film to a silicon dioxide film.

In another aspect, the present invention provides a process for forming a silicon dioxide film comprising coating polysilazane and a compound containing a phenolic hydroxyl group on a base, and converting the resulting film to a silicon dioxide film.

DESCRIPTION OF THE PREFERRED EMBODIMENTS

In the first process of the present invention, conversion of the polysilazane film to the silicon dioxide film may be effected by subjecting the polysilazane film to a first heat treatment, then to water absorption treatment, and subsequently to a second heat treatment, or subjecting the polysilazane film to irradiation of ultraviolet rays (UV), then to water absorption treatment, and subsequently to heat treatment.

For example, polysilazane is spin-coated onto a base on which a silicon dioxide film is to be formed, and after it is further molten and flattened by heat treatment, polysilazane is converted to silicon dioxide so as to form the silicon dioxide film. When the polysilazane film is converted to the silicon dioxide film, the first heat treatment is applied to the polysilazane film at a temperature of preferably at least 300° C. and, if desired, in an inert gas atmosphere, the film is then immersed in hot water for water absorption treatment, and thereafter the second heat treatment is applied, or UV irradiation is effected by using a high pressure mercury lamp, water absorption treatment is effected by washing with water, and thereafter heat treatment is carried out at a temperature of at least 350° C.

In the present invention, it may also be possible to carry out the water absorption treatment by leaving the film standing at a humidity of around 40% for at least one week, but this method requires a long time and is not practical.

In the second process of the present invention, the conversion of the coated film to the silicon dioxide film may be carried out by subjecting the coated film to heat treatment in an oxidizing atmosphere, preferably at a temperature of at least 350° C.

Preferably, the oxidizing atmosphere is an atmosphere containing oxygen in an amount of at least 1% by volume or an atmosphere containing steam. Before the heat treatment for converting the coated film to the silicon dioxide film, heat treatment for drying a solvent in the coated film and/or for melting and flattening the coated film may optionally be carried out. The coated film may further be subjected to water absorption treatment after the heat treatment for drying the solvent in the coated film and/or for melting and flattening the coated film. The heat treatment for drying the solvent in the coated film and/or for melting and flattening the coated film may be carried out under irradiation with ultraviolet rays.

Typical examples of the compound containing a phenolic hydroxyl group include phenol, o-, m- or p-cresol, ethylphenol, propylphenol and allylphenol. The weight ratio of the polysilazane to the phenolic hydroxyl group-containing compound employed in the present invention may preferably be 100:3 to 100:30.

The polysilazane usable for the present invention may include polymers represented by the following formula, wherein R represents hydrogen, lower alkyl of 1 to 4 carbon atoms or phenyl, and n is a positive integer.

According to the present invention, the silicon dioxide film having a relatively large thickness of at least 0.5 $\mu$m, which is useful for flattening the base step, can be formed.

The film formed according to the present invention is the silicon dioxide film and is not oxidized by the $O_2$ plasma treatment employed in the fabrication process of the semiconductor device. Accordingly, the film can be used as an insulating film without being passed through complicated steps such as an etch-back step.

In comparison with the conventional method proposed as a method of forming the insulating film using polysilazane, the process of the present invention can suppress emission of the amine type gas due to re-heating, and can prevent corrosion of the aluminum wiring due to the vapor and the amine type gas.

Figure 2:
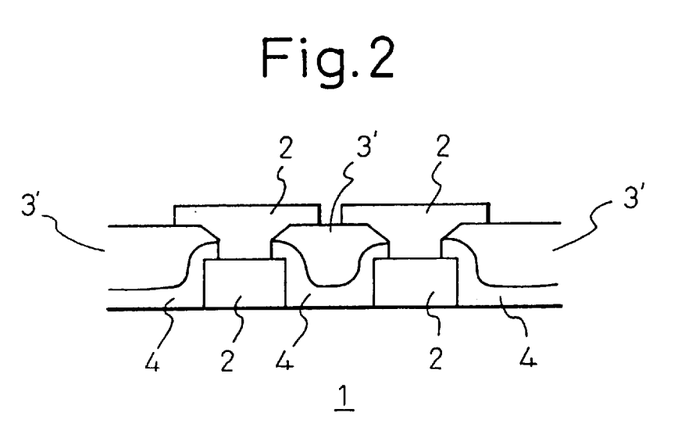
FIG. 2 is a schematic cross-sectional view of a semiconductor device having a silicon dioxide film formed according to the present invention.

When the silicon dioxide film formed by the present process is combined with a CVD-$SiO_2$ film or a CVD-PSG film which has been conventionally used so as to form an insulating film, the etching rate of the present film by fluorine plasma is equal to that of the CVD-$SiO_2$ film or the PSG film. Therefore, as shown in FIG. 2, a taper can be formed when forming through holes to establish vertical conduction, and excellent coverage of wirings can be obtained. In FIG. 2, 1 denotes a silicon substrate, 2 denotes an aluminum wiring, 3 denotes a silicon dioxide layer formed according to the present invention, and 4 denotes a CVD film.

Hereinafter, the present invention will be explained in further detail with reference to the following non-limitative examples.

EXAMPLE 1

A solution of 20% by weight of polysilazane in xylene was prepared by using a polysilazane having a molecular weight of about 3,000 and represented by the following formula, The polysilazane solution was spin-coated onto a silicon flat sheet, and the resulting polysilazane film was dried and heat treated under the condition tabulated in Table 1 in an oxygen stream. The surface condition of the film was evaluated by placing a water droplet on the resulting treated substrate and measuring a contact angle between the substrate and water. Table 1 tabulates the relationship between the heat-treating condition and the contact angle.

TABLE 1

| heat-treating condition | contact angle of water |
|---|---|
| 150° C., 3 minutes | 92° |
| 250° C., 3 minutes | 90° |
| 350° C., 3 minutes | 49° |

TABLE 1-continued

| heat-treating condition | contact angle of water |
|---|---|
| 350° C., 1 minute | 52° |
| 350° C., 5 minutes | 39° |
| 350° C., 10 minutes | 39° |

It can be understood from Table 1 that the contact angle became small due to the heat treatment between 250° C. and 350° C., and the film surface changed to hydrophilicity.

EXAMPLE 2

A polysilazane solution as used in Example 1 was spin-coated onto a silicon flat sheet, and the resulting polysilazane film was dried and heat-treated under the condition tabulated in Table 2 while ultraviolet ray (UV) irradiation was carried out using a high pressure mercury lamp (1 KW) in air. The surface condition of the film was evaluated by placing a water droplet on the resulting treated substrate and measuring a contact angle between the substrate and water. Table 2 tabulates the relationship between the heat-treating condition and the contact angle.

TABLE 2

| UV curing condition | contact angle of water |
|---|---|
| 150° C., 3 minutes | 43° |
| 250° C., 3 minutes | 15° |
| 350° C., 3 minutes | 6° |
| 350° C., 1 minute | 6° |
| 350° C., 5 minutes | 3.5° |
| 350° C., 10 minutes | 3.5° |

In Table 2, the change of the film to hydrophilicity due to the UV irradiation could be observed even at a relatively low substrate temperature range of 150° C. The value of the contact angle was generally low, and a film having high hydrophilicity and a contact angle of up to 10° could be obtained at a substrate temperature of not lower than 250° C. Further, when the substrate temperature was set to 350° C., a film having high hydrophilicity could be obtained even by a treatment for one minute.

EXAMPLE 3

Figure 4:
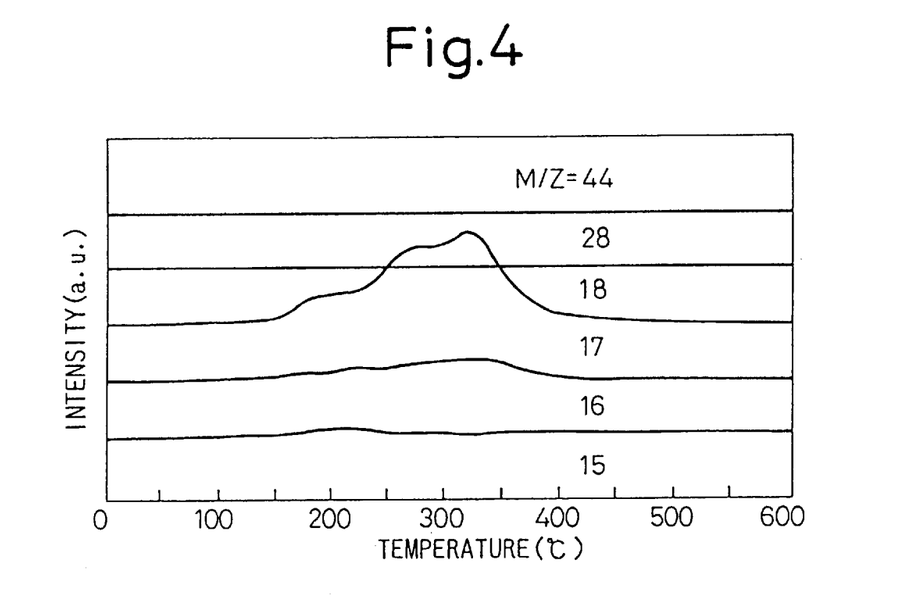
FIG. 4 is a diagram showing the result of degassing analysis of a silicon dioxide film obtained in another example after heating.
Figure 5:
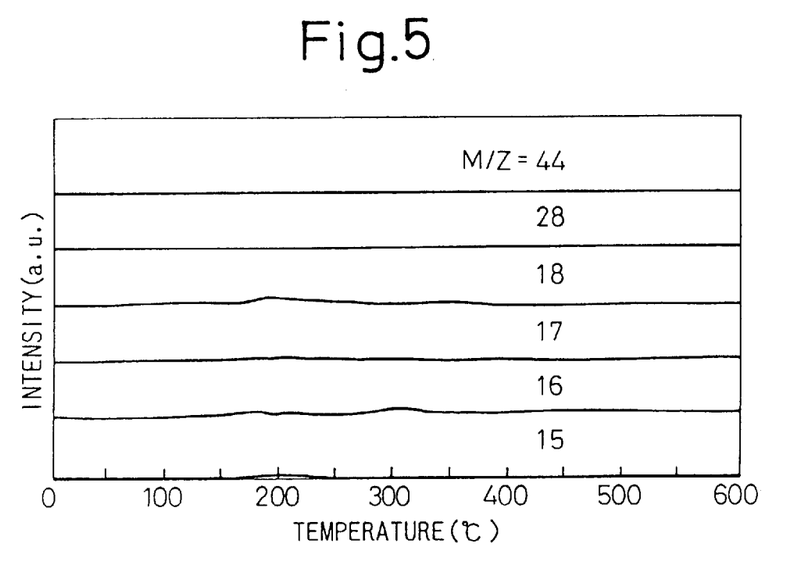
FIG. 5 is a diagram showing the result of degassing analysis of a silicon dioxide film obtained in another example after heating.

A polysilazane solution as used in Example 1 was spin-coated on a silicon flat sheet, and the resulting polysilazane film was dried and heat-treated at 450° C. for 30 minutes in an oxygen stream (treatment 1). Separately, a polysilazane film likewise obtained was heat-treated at 350° C. for 3 minutes in air, was then immersed in hot water for 5 minutes, and was thereafter heat-treated at 450° C. for 30 minutes (treatment 2). Another polysilazane film was heat-treated at 250° C. for 3 minutes in air while UV irradiation was carried out using a high pressure mercury lamp (1 KW), was then washed with water for 5 minutes and was thereafter heat-treated at 450° C. for 30 minutes (treatment 3). Next, heating/degassing analysis was carried out for each of the resulting films. The results are shown in FIGS. 3 to 5. It could be understood from these diagrams that large quantities of amine type gases were emitted by re-heating according to the conventional method (treatment 1). On the other hand, according to the method of the present invention (treatment 2 and treatment 3), films which hardly emitted the amine type gas even at the time of re-heating could be obtained (FIGS. 4 and 5).

EXAMPLE 4

Figure 6:
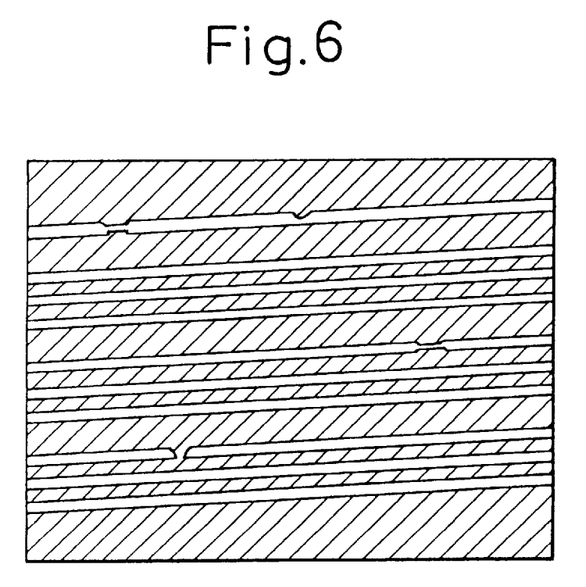
FIG. 6 is a schematic view showing the state of a silicon dioxide film on an aluminum wiring obtained in an example.
Figure 7:
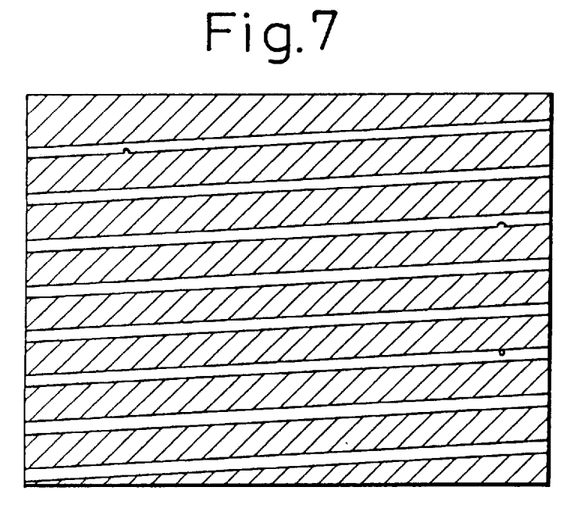
FIG. 7 is a schematic view showing the state of a silicon dioxide film on an aluminum wiring obtained in another example.
Figure 8:
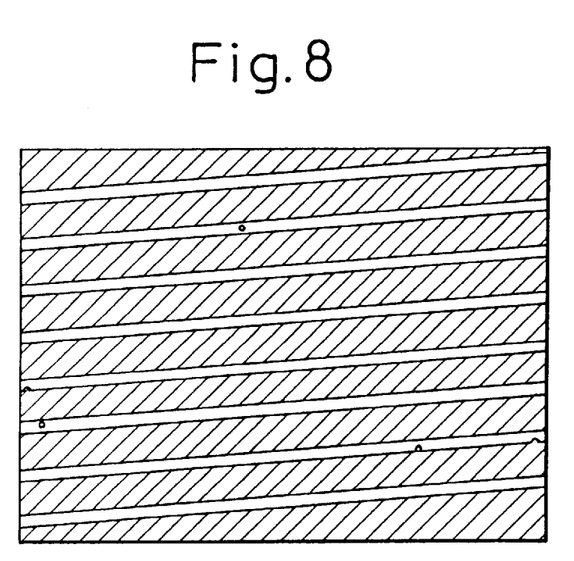
FIG. 8 is a schematic view showing the state of a silicon dioxide film on an aluminum wiring obtained in another example.

A plasma-SiON film was formed to a film thickness of 3,000 Å on a substrate having aluminum wirings having a thickness of 8,000 Å, and then, polysilazane was spin-coated in the same manner as in Example 1. Heat treatment was carried out at 450° C. for 30 minutes in a vapor atmosphere (treatment 4). Another polysilazane film likewise obtained was heat-treated at 350° C. for 3 minutes in an inert gas atmosphere, was then immersed in hot water at 80° C. for 5 minutes, and was thereafter heat-treated at 450° C. for 30 minutes (treatment 5), or UV irradiation was carried out using a high pressure mercury lamp (1 KW) for 3 minutes, washing with water was effected for 5 minutes and heat-treatment was carried out at 450° C. for 30 minutes (treatment 6). The condition of each of the resulting films is shown in FIGS. 6 to 8. It could be understood from these drawings that corrosion of the aluminum wirings, which was observed in the heat-treatment in the vapor atmosphere (treatment 4, FIG. 6), could not be observed in the films formed by the method of the present invention (treatment 5, FIG. 7 and treatment 6, FIG. 8).

EXAMPLE 5

Figure 9:
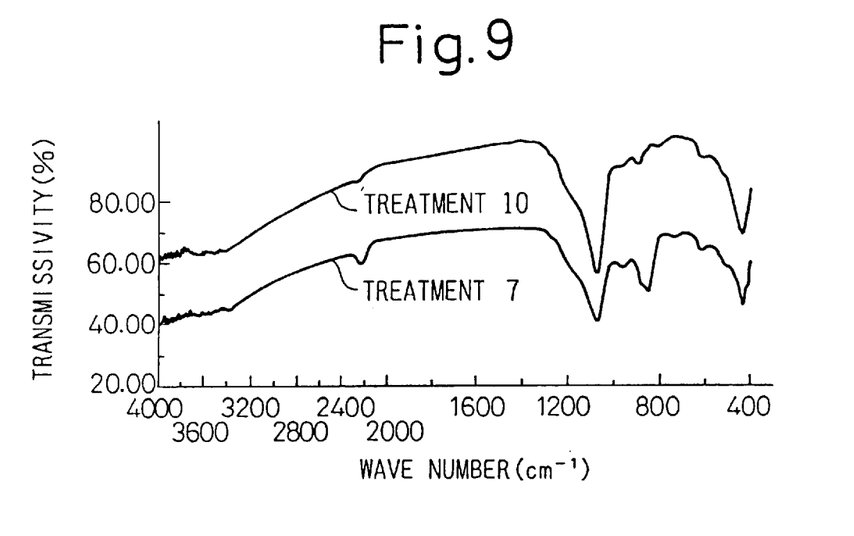
FIG. 9 is a diagram showing the change of infrared absorption spectrum at each treatment step in an example.
Figure 10:
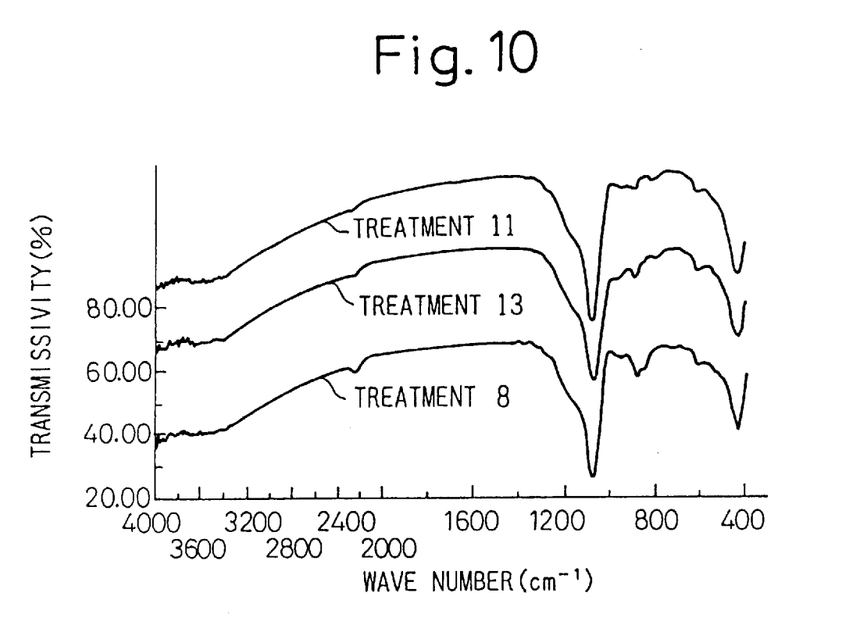
FIG. 10 is a diagram showing the change of infrared spectrum at each treatment step in another example.
Figure 11:
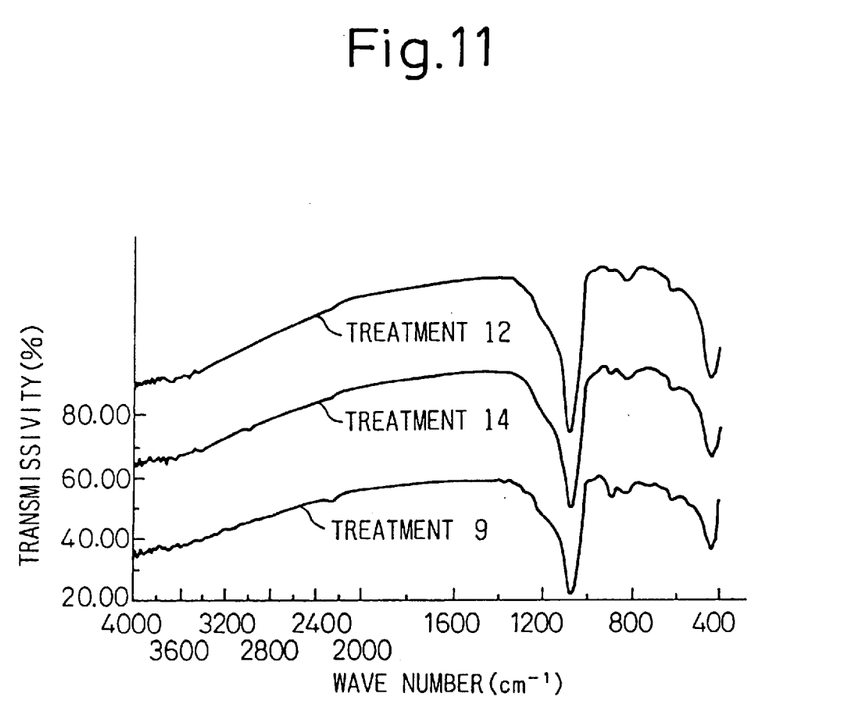
FIG. 11 is a diagram showing the change of infrared spectrum at each treatment step in another example.

A plasma CVD-SiON film was formed to a thickness of 0.3 μm on a Si substrate on which devices and an Al wiring (first layer) were formed. Subsequently, a polysilazane solution as used in Example 1 was spin-coated to a thickness of 0.5 μm on the silicon substrate and was heat-treated at 350° C. for 3 minutes (treatment 7). Next, the substrate was then immersed in hot water at 80° C. for 3 minutes for water absorption treatment (treatment 8) and was heat-treated at 450° C. for 30 minutes (treatment 9) to obtain a silicon dioxide film. (The change of infrared absorption spectrum at each treatment step is shown in FIGS. 9 to 11.) At this time, a step generated by the first layer wiring was made flat to 0.2 μm or below. Next, etching was carried out using a fluorine type plasma and a 0.5 μm-thick novolak type positive photoresist to form through holes. The minimum through-hole diameter at this time was 0.3 μm square. After the through holes were formed, burying of Al and second layer Al wire were carried out. A 1.3 μm-thick phosphor glass layer was formed as a protective layer, and windows for taking out electrodes were formed. Thus a semiconductor device was obtained.

EXAMPLE 6

A plasma CVD-SiON film was formed to a thickness of 0.3 μm on a Si substrate on which devices and an Al wiring (first layer) where formed. Subsequently, a polysilazane solution as used in Example 1 was spin-coated to a thickness of 0.5 μm on the silicon substrate and was heat-treated at 150° C. for 15 minutes. Then, UV irradiation was carried out (treatment 10). Subsequently, the substrate was immersed in hot water at 80° C. for 3 minutes for water absorption treatment (treatment 11), was heat-treated at 450° C. for 30 minutes (treatment 12) or was washed with water for 5 minutes (treatment 13), and was then heat-treated at 450° C. for 30 minutes (treatment 14) to obtain a silicon dioxide film. (The change of the infrared absorption spectrum at each treatment step is shown in FIGS. 9 to 11.) The step generated at this time by the first layer wiring is made flat to 0.2 μm or below. Next, etching was carried out by fluorine type plasma using a 0.5 μm-thick novolak type positive resist to form through holes. At this time, the minimum through-hole diameter was 0.3 μmφ. After the through holes were formed, burying of Al into the through holes and second layer Al wiring were carried out. A 1.3 μm-thick phosphor glass layer was formed as a protective layer, and windows for taking out electrodes were formed. Thus a semiconductor device was obtained.

EXAMPLE 7

Figure 12:
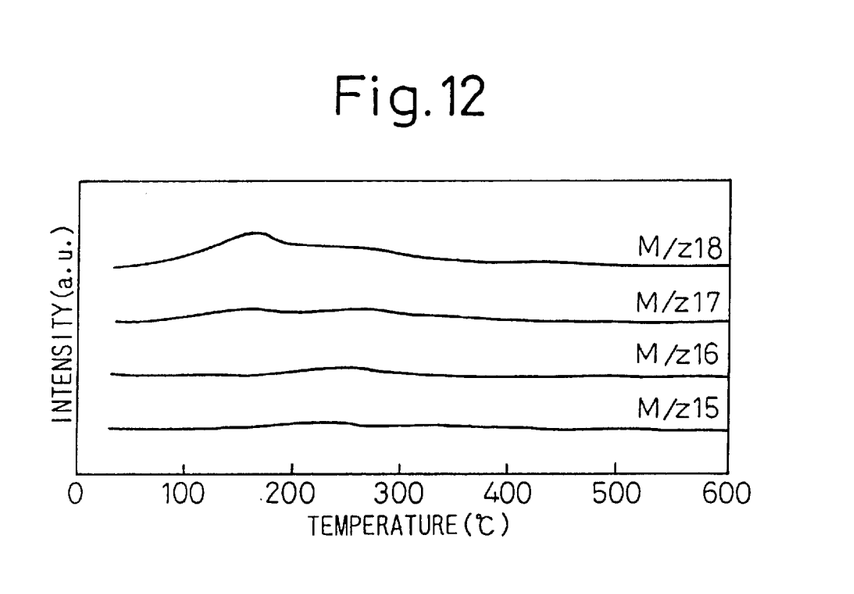
FIG. 12 is a diagram showing the result of degassing analysis of a silicon dioxide film obtained in another example after heating.

A solution of 20% by weight of polysilazane in xylene was prepared by using a polysilazane having a molecular weight of about 3,000 and represented by the following formula, The solution contained phenol in an amount of 10% based on the weight of the polysilazane. The polysilazane solution was spin coated on a silicon flat sheet, and after drying, the sheet with the coated film was heat treated at 250° C. for 3 minutes for flattening the coated film. Then, the sheet was heat treated at 450° C. for 30 minutes under oxygen atmosphere to convert the coated film to a silicon dioxide film. The cracking resistance of the silicon dioxide film was 1.5 μm. When the silicon dioxide film was subjected to heating/degassing analysis, it was found, as shown in FIG. 12, that no emission of an amine type gas occurred (Mz=15, 16 and 17).

Then, in the same manner as mentioned above, a silicon dioxide film was formed on a substrate having aluminum wirings of a thickness of 8,000 Å. The steps on the substrate surface were 0.1 μm and, thus, the steps formed by the aluminum wirings were made flat. The silicon dioxide film was further subjected to oxygen plasma treatment. No reduction of the film thickness or no formation of cracks occurred.

EXAMPLE 8

Figure 13:
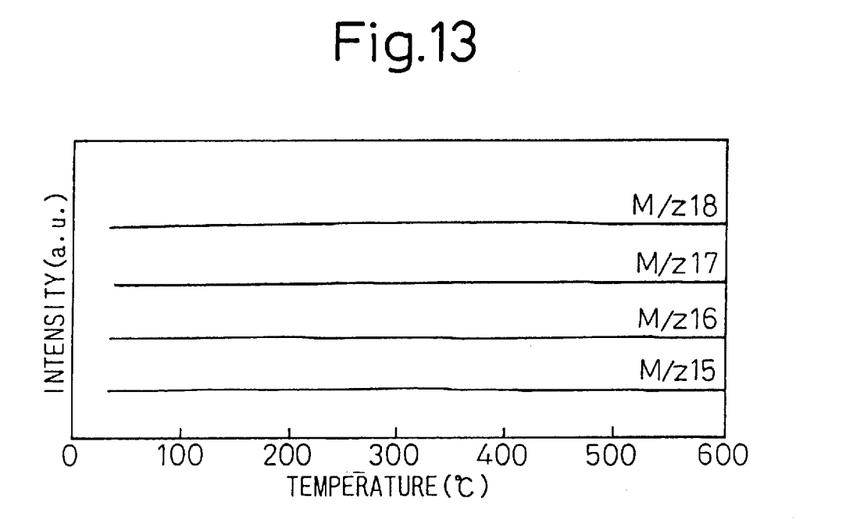
FIG. 13 is a diagram showing the result of degassing analysis of a silicon dioxide film obtained in another example after heating.

A phenol-containing xylene solution of polysilazane as used in Example 7 was spin coated on a silicon flat sheet, and after drying, the sheet with the coated film was heat treated at 250° C. for 3 minutes. Then, the sheet was heat treated at 450° C. for 30 minutes under steam atmosphere to convert the coated film to a silicon dioxide film. The cracking resistance of the silicon dioxide film were 1.5 μm. When the silicon dioxide film was subjected to heating/degassing analysis, it was found, as shown in FIG. 13, that no emission of an amine type gas occurred (Mz=15, 16 and 17).

Then, in the same manner as mentioned above, a silicon dioxide film was formed on a substrate having aluminum wirings of a thickness of 8,000 Å. The steps on the substrate surface were 0.1 μm and, thus, the steps formed by the aluminum wirings were made flat. The silicon dioxide film was further subjected to oxygen plasma treatment. No reduction of the film thickness or no formation of cracks occurred.

EXAMPLE 9

Figure 14:
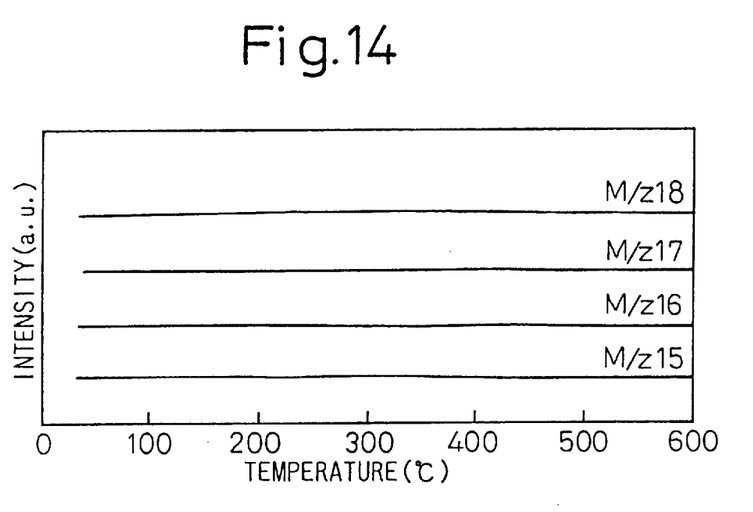
FIG. 14 is a diagram showing the result of degassing analysis of a silicon dioxide film obtained in another example after heating.

A phenol-containing xylene solution of polysilazane as used in Example 7 was spin coated on a silicon flat sheet, and after drying the sheet with the coated film was heat treated at 250° C. for 3 minutes. Then, the sheet was immersed in warm water of 80° C. for 3 minutes and heat treated at 450° C. for 30 minutes under oxygen atmosphere to convert the coated film to a silicone dioxide film. The cracking resistance of the silicon dioxide film was 1.5 μm. When the silicon dioxide film was subjected to heating/degassing analysis, it was found, as shown in FIG. 14, that no emission of an amine type gas occurred (Mz=15, 16 and 17).

Then, in the same manner as mentioned above, a silicon dioxide film was formed on a substrate having aluminum wirings of a thickness of 8,000 Å. The steps on the substrate surface were 0.1 μm and, thus, the steps formed by the aluminum wirings were made flat. The silicon dioxide film was further subjected to oxygen plasma treatment. No reduction of the film thickness or no formation of cracks occurred.

EXAMPLE 10

Figure 15:
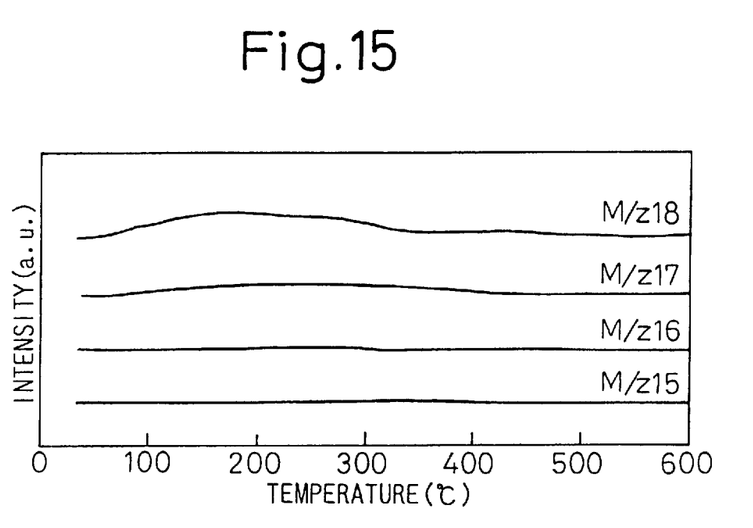
FIG. 15 is a diagram showing the result of degassing analysis of a silicon dioxide film obtained in another example after heating.

A phenol-containing xylene solution of polysilazane as used in Example 7 was spin coated on a silicon flat sheet, and after drying, the sheet with the coated film was heat treated at 250° C. for 3 minutes. Then, the sheet was heat treated at 350° C. for 3 minutes under irradiation with ultraviolet rays and then at 450° C. for 30 minutes under oxygen atmosphere to convert the coated film to a silicon dioxide film. The cracking resistance of the silicon dioxide film was 1.5 μm. When the silicon dioxide film was subjected to heating/degassing analysis, it was found, as shown in FIG. 15, that no emission of an amine type gas occurred (Mz=15, 16 and 17).

Then, in the same manner as mentioned above, a silicon dioxide film was formed on a substrate having aluminum wirings of a thickness of 8,000 Å. The steps on the substrate surface were 0.1 μm and, thus, the steps formed by the aluminum wirings were made flat. The silicon dioxide film was further subjected to oxygen plasma treatment. No reduction of the film thickness or no formation of cracks occurred.

As is obvious from the foregoing explanation, the silicon dioxide film formed according to the process of the present invention can flatten a substrate having corrugations on the base, and can suppress damage to the wiring material during the film formation process. Accordingly, the silicon dioxide film is useful as an insulating or flattening film in a semiconductor device or a flat display device.

We claim:

1. A process for forming a silicon dioxide film comprising applying a mixture of polysilazane and a compound containing a phenolic hydroxyl group on a base to form a coated film, and converting the resulting coated film to said silicon dioxide film.

2. A process according to claim 1, wherein the conversion of the coated film to said silicon dioxide film is carried out by subjecting said coated film to heat treatment in an oxidizing atmosphere.

3. A process according to claim 2, wherein said oxidizing atmosphere is an oxygen-containing or steam-containing atmospheres.

4. A process according to claim 2, wherein heat treatment for drying a solvent in said coated film and/or for melting and flattening said coated film is carried out before said heat treatment for converting said coated film to said silicon dioxide film.

5. A process according to claim 4, wherein said coated film is subjected to water absorption treatment before said heat treatment for converting said coated film to said silicon dioxide film and after said heat treatment for drying said solvent in said coated film and/or for melting and flattening said coated film.

6. A process according to claim 4, wherein said heat treatment for drying said solvent in said coated film and/or for melting and flattening said coated film is carried out under irradiation with ultraviolet rays.

7. A process according to claim 1, wherein said silicon dioxide film is further subjected to oxygen plasma treatment.

* * * * *